United States Patent [19]
Proctor et al.

[11] Patent Number: 5,682,159
[45] Date of Patent: Oct. 28, 1997

[54] METHOD AND APPARATUS FOR REDUCING PHASE LAG RESULTING FROM DIGITAL TO ANALOG CONVERSION

[75] Inventors: William P. Proctor, Boise; Vernon L. Knowles, Eagle; Robert Kier, Boise, all of Id.

[73] Assignee: Hewlett-Packard Company, Palo Alto, Calif.

[21] Appl. No.: 603,626

[22] Filed: Feb. 21, 1996

[51] Int. Cl.⁶ .......................... H03M 1/06; G11B 5/576
[52] U.S. Cl. ......................................... 341/118; 360/77.05
[58] Field of Search ................................ 341/118, 141, 341/144; 360/75, 77.01, 77.02, 77.08, 78.01, 78.04, 78.14

[56] References Cited

U.S. PATENT DOCUMENTS

| | | | |
|---|---|---|---|
| 4,315,199 | 2/1982 | Kyomasu et al. | 318/601 |
| 5,105,318 | 4/1992 | Tsuneta et al. | 360/77.01 |
| 5,153,787 | 10/1992 | Sidman | 360/77.05 |
| 5,202,821 | 4/1993 | Bauck et al. | 364/162 |
| 5,220,468 | 6/1993 | Sidman | 360/77.05 |
| 5,533,072 | 7/1996 | Georgiou et al. | 375/371 |

*Primary Examiner*—Marc S. Hoff
*Attorney, Agent, or Firm*—Gregg W. Wisdom

[57] ABSTRACT

A method and apparatus for implementing a zero order hold function in the digital to analog conversion process in a digital control system reduces the phase lag contributed by the digital to analog conversion process relative to a conventional implementation of the zero order hold function. The apparatus for implementing the reduced phase lag zero order hold function employs a digital signal processor, a plurality of digital buffers, a digital multiplexing element, and a digital to analog converter. Phase lag is reduced by generating, from the digital to analog converter, for a fraction of the sample period, a waveform having a constant analog voltage with an amplitude which is scaled by the reciprocal of said fraction relative to a conventional zero order hold function. During the remainder of the sample period a substantially constant offset analog voltage is generated by the digital to analog converter. Alternatively, the time compression and amplitude scaling required to implement the reduced phase lag zero order hold function can be performed within the digital signal processor in the digital control system.

20 Claims, 10 Drawing Sheets

METHOD AND APPARATUS FOR REDUCING PHASE LAG RESULTING FROM DIGITAL TO ANALOG CONVERSION

TECHNICAL FIELD

The present invention relates to digital control systems for the control of dynamic systems. More particularly, the present invention relates to an implementation of a zero order hold function for accomplishing digital to analog conversion in a sampled data system.

BACKGROUND OF THE INVENTION

Computer hard disk drives are available in a wide variety of configurations which enable a broad range of storage capacities for information stored on a disk, or platter. For applications requiring only minimal data storage, a single magnetic hard disk proves suitable, For applications requiring considerably more storage capacity, multiple-hard disks are more desirable. Irrespective of the hard drive configuration, typically both the top and bottom surfaces of each disk are configured to store tracks of information by recording magnetic transitions in the magnetic media provided on the surface of the disk. In general, a rotatable support arm moves a plurality of transducers (heads), each head attached to the support arm through an actuator arm, over the tracks on each disk surface to read and write data between the heads and the tracks on each disk surface.

The available configurations of computer hard disk drives that are capable of aligning read/write heads with desired data tracks on a hard disk can generally be classified into two categories: dedicated servo disk drives and embedded servo disk drives. Dedicated servo disk drives have one or more stacked magnetized hard disks wherein one entire surface (servo surface) of a disk is dedicated to storing servo position information (recorded during manufacture) that is read by a read-only head (servo head) to adjust the positions of the read/write heads over their associated disk surfaces. In contrast, embedded servo disk drives have one or more magnetic disks, each of which store bursts of servo position information (recorded during manufacture) embedded at regular intervals amid the data tracks on the disk surface so that each disk has thin "pie-shaped" slices (servo sectors) reserved for the servo position information interspersed between larger "pie-shaped" regions (data sectors) for data storage. For either of the read/write head alignment techniques, servo position information is used to position the read/write heads over a data track.

In a dedicated servo disk drive, the actuator arm carrying the servo head positions the entire support arm by controlling the positioning of the servo head over a desired servo data track on the servo surface. Each of the actuator arms are configured so that they are substantially parallel to one another. As a result, the support arm concurrently aligns each of the read/write heads over the data track on the disk surface associated with the read/write head, corresponding to the servo track. In this manner, the servo head is utilized to position the entire support arm and each of the read/write heads in positional relation with tracks of information on the surfaces associated with each of the heads.

In an embedded servo disk drive, each read/write head is used to position itself over the data track at which the head is located using the embedded servo information. The bursts of servo position information located between the data sectors contain servo position data used to position the read/write head over a data track. As is the case for a dedicated servo disk drive, each of the actuator arms are configured so that they are substantially parallel to one another. However, positioning over a data track on a surface is accomplished through positioning the support arm using the read/write head associated with that surface.

In conventional disk drives, a servo control system employs negative feedback in order to regulate the position of the read/write heads over data tracks stored on surfaces of each disk. The servo control system activates a rotary actuator motor which controls the position of the support arm, thereby controlling the position of the read/write heads. The servo control system receives input signals from the servo head or the read/write head, depending upon whether the disk drive uses dedicated servo or imbedded servo, indicating the position of the head in relation to the servo position information. The servo control system responds to these input signals to attempt to minimize displacement between the read/write head and the data track center by providing a correction signal to the rotary actuator motor. In order to accurately control positioning of the read/write heads over data tracks on the disk surfaces, the servo control system should be able to accurately produce a stable and controlled steady-state error signal indicative of positioning of the servo head with respect to a desired track of servo information, enabling smooth and accurate rotational control of the servo motor in a dynamic manner while reading and writing from surfaces of a disk.

The servo control system must also be able to minimize the offset between the read/write head and the data track in the presence of disturbances tending to increase the offset between the read/write head and the data track. Disturbances can originate from a variety of sources such as: a circularity of the factory recorded servo position information, defects in the factory recorded servo position information, mechanical vibrations, thermal effects, and electrical noise in the measurement channel.

Prior to the commercial availability of digital signal processing hardware of sufficient computational capability and of sufficiently low cost, disk drive servo control systems were implemented using analog control techniques. In servo control systems using analog control techniques a position error signal generated from the demodulation of the phases of servo position information is applied to the servo control system. The servo control system subjects the position error signal to the control law used, for example a PID control law, and compensation and notch filtering to achieve the desired performance characteristics and stability margin for the positioning system. The output signal of the servo control system is the input to a power amplifier, referred to as an actuator driver which drives the rotary actuator motor to minimize the displacement of the read/write head from the track center.

The term "sampled data system" refers to a system employing both discrete and continuous signals to accomplish its purpose. The term "digital control system" refers to a system which employs a digital signal processing element, such as a microprocessor or a specialized digital signal processor, to accomplish the control of a process or an apparatus. The term "digital servo control system" refers to a system which employs a digital signal processing element to accomplish the control of a mechanical apparatus. A digital control system is a type of sampled data system and a digital servo control system is a type of digital control system. The term "servo control system" refers to a sampled data or analog system used to control a mechanical apparatus.

Digital servo control systems are now commonly implemented using digital signal processing techniques. In digital servo control systems, analog to digital conversion is performed upon the position error signal generated from the demodulation of the phases of servo position information. Digital signal processing is performed upon data resulting from the analog to digital conversion to apply the desired control law and to implement compensation and notch filtering. Digital to analog conversion is performed upon the digitally filtered data. This analog output signal of the servo control system is the input to the actuator driver which activates the rotary actuator motor to minimize the displacement of the read/write head from the track center. Further information about digital control systems is available in the text "Digital Control of Dynamic Systems", by Gene F. Franklin, et. al., 1990, Addison-Wesley, the disclosure of which is hereby incorporated by reference.

An important consideration for stability in any servo control system is the amount of phase shift which occurs through the system, as measured through the servo control system and the process or apparatus to be controlled by the control system, referred to as the "plant", at the frequency, known as the gain cross over frequency, at which the gain through the servo control system and the plant is unity. Elements in the servo control system or plant which contribute phase lag at or below the gain cross over frequency are of concern. The difference between this phase shift and a phase shift of −180 degrees at the gain cross over frequency provides a measurement of the stability of the system known as the phase margin. A lagging phase shift of magnitude of 180 degrees or greater at the unity gain frequency indicates that the system is unstable. Also of importance is the amount of gain, as measured throughout the servo control system and the plant, at the frequency, known as the phase cross over frequency, at which the phase shift through the servo control system and the plant reaches −180 degrees. Elements in the servo control system or plant which contribute phase lag at or below the phase cross over frequency are of concern. The difference between the magnitude of the gain at the phase cross over frequency and a gain of unity provides a measurement of the stability of the system known as the gain margin.

The frequency response characteristics of the plant can contribute to the phase lag of the system and consume at least a portion of the maximum amount of phase lag allowable consistent with the desired phase margin. Notch filtering is implemented in the servo control system to attenuate the effect of mechanical resonances which, if left unattenuated, will result in instability of the servo control system. An undesired side effect of the notch filtering is to contribute phase lag below the gain cross over frequency and the phase cross over frequency of the plant and servo control system. In addition, in digital servo control systems, the digital to analog conversion process, most commonly implemented through a digital to analog converter using a zero order hold technique, contributes to phase lag. On occasion, lead networks are employed to offset the effect of the phase lag contributed by the elements of the servo control system and the plant. However, the resulting reduction in the low frequency gain of the servo control system is undesirable.

SUMMARY OF THE INVENTION

This invention relates to an implementation of a zero order hold function in a sampled data system. This implementation of the zero order hold function has a phase response which results in less phase lag, over a given frequency range, contributed by the digital to analog conversion process than a conventional zero order hold function.

In a sampled data system which generates, in succession, a plurality of digital values at a predetermined rate, such as the sample rate, having a corresponding predetermined time interval, such as the sample period, a method is implemented to reduce the phase lag generated by digital to analog conversion. A first substantially constant analog voltage is generated for a first time interval using a digital to analog converter. The first substantially constant analog voltage is determined by the product of a scale factor and one of the plurality of digital values. The first time interval is determined by a ratio of the predetermined time interval and the scale factor. A second substantially constant analog voltage is generated for a second time interval using the digital to analog converter. The second substantially constant analog voltage is determined by an offset digital value. The second time interval is determined by the difference between the predetermined time interval and the first time interval.

DESCRIPTION OF THE DRAWINGS

A more thorough understanding of the invention may be had from the consideration of the following detailed description taken in conjunction with the accompanying drawings in which.

DETAILED DESCRIPTION OF THE PREFERRED EMBODIMENTS

The present invention is not limited to the specific exemplary embodiment illustrated herein. In the description of the preferred embodiments, the zero order hold function implemented in this embodiment will be discussed in the context of a digital servo control system used in the positioning of a read/write head using a rotary actuator motor in a dedicated servo disk drive. However, one skilled in the art will recognize that the implementation of the zero order hold function of this embodiment is not limited to application in a digital servo control system in a disk drive. Any sampled data system requiring a digital to analog conversion element and benefiting from a reduction in the low frequency phase lag could make use of the zero order hold function of this embodiment. Digital servo control system applications such as head positioning in an optical storage disk, or the attitude adjustment of a mechanical assembly such as a dish antenna or a telescope could employ the zero order hold function of this embodiment.

Figure 1:
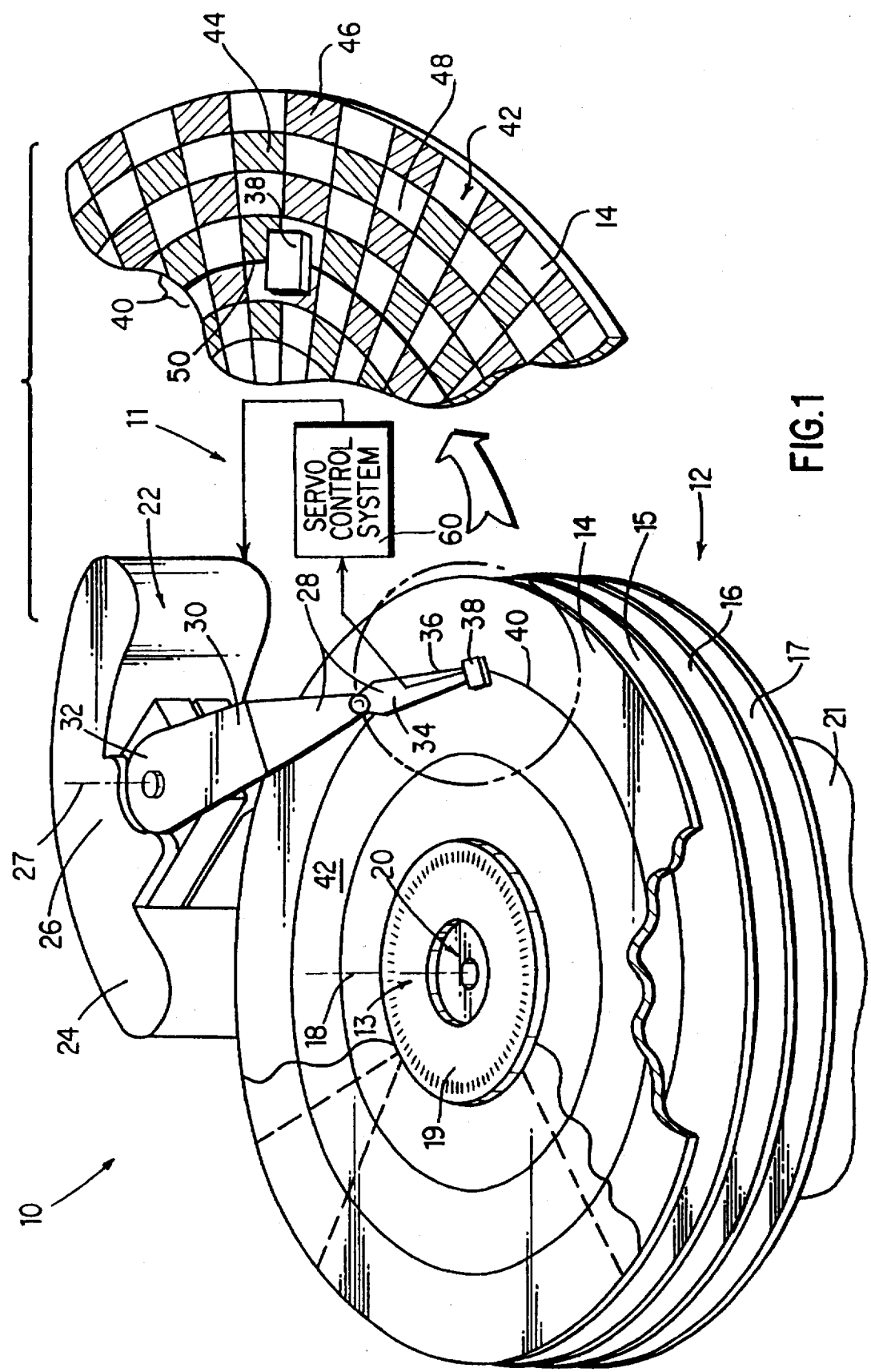
FIG. 1 is a diagrammatical perspective view of a disk drive including a digital servo control system containing the implementation of the zero order hold of this embodiment.

FIG. 1 shows a disk drive data storage device 10 including a digital servo control system 11, a stacked array 12 of multiple magnetic hard disks, a rotary actuator motor 24, and head arm assembly 22. Multiple magnetic disks 14–17 are aligned substantially along a central axis of rotation 18. The magnetic disks 14–17 have associated, centrally located hubs (referenced generally by numeral 13) and are separated from one another by interposed spacers (not shown). The magnetic disks 14–17 are rotatably carried by a stationary support, or frame 21 via a spindle assembly 20 empowered for rotatable motion by a motor or other drive mechanism (not shown) to spin about axis 18 at a substantially constant operating speed. The spindle assembly 20 includes a top clamp 19 for retaining the magnetic disks 14–17 in rotationally fixed relation with interleaved adjacent disks and interposed spacers along associated disk hubs 13. Details of the spindle assembly 20 and the frame 21 are of a conventional design and are therefore not described herein in any detail except as necessary to describe the present embodiment.

A head/arm assembly 22 is rotatably positioned adjacent to the stacked disk array 12 by way of a rotary actuator motor 24 configured to rotatably position the assembly relative to a fixed support member 26. The head arm assembly 22 includes actuator arm 28. Actuator arm 28 is comprised of carrier arm 30, having a proximal end 32, and suspension member 34. Typically, suspension member 34 is swaged, spot welded, or otherwise fastened to the carrier arm 30. Suspension member 34 includes proximal end 36. Multiple actuator arms are vertically aligned to form a comb-like array interleaved with magnetic disks 14–17. This array of actuator arms is rotationally positioned by activation of the rotary actuator motor 24 relative to support member 26 and array 12.

In a dedicated servo disk drive a servo head 38 is mounted at distal end 36 of suspension member 34. The actuator arm 28 is pivotally connected relative to the disk drive data storage device 10 at a location spaced from the servo head 38 which allows for rotational positioning of the servo head 38 over the top surface of magnetic disk 14. Servo head 38 is comprised of a gimble assembly including a slider physically connected through a gimble mount to suspension member 34. The servo head 38 is mounted to the slider. In a similar manner, the plurality of read/write heads (not shown) are mounted on similarly situated suspension members in vertical alignment beneath suspension member 34 as depicted in FIG. 1 such that each surface of magnetic disks 14–17 has an associated head.

Servo head 38 of FIG. 1 is used to position actuator arm 28, by activating rotary actuator motor 24, over the desired prerecorded servo data track 40 on the top surface 42 of magnetic disk 14 so that the plurality of actuator arms (not shown) associated with the other surfaces of magnetic disks 14–17 and in vertical alignment with actuator arm 28 have their associated read/write heads positioned over the desired data tracks. The read/write heads magnetically read/record information from/to their associated surfaces on magnetic disks 14–17 during data retrieval/storage.

With this design, the array of actuator arms supports each of the read/write heads across each of the associated surfaces of magnetic disks 14–17 as actuator arm 28 is controllably rotated about axis 27. The slider rotates the servo head 38 by way of the accompanying gimble assembly to insure the servo head maintain substantially parallel alignment with the tangent to each track at the circumferential location of the head over the track, thereby essentially eliminating any effects of head skew. In like manner each of the read/write heads is maintained in substantially parallel alignment with the tangent to each associated track at the circumferential location of the read/write head over the associated track. If the heads were rigidly fixed to their corresponding suspension member 34, head skew occurs depending upon the radial position of the head relative to the central axis of rotation 18, as the actuator arms and associated heads are rotated between the inner diameter of magnetic disk 14 and the outer diameter of magnetic disk 14.

The servo head 38 reads prerecorded servo position information on top surface 42 of magnetic disk 14. Referring to the enlarged circle region of FIG. 1, the servo position information is comprised of fields of magnetized regions 44, 46 alternating with unmagnitized regions 48 on the top surface 42 of magnetic disk 14. This pattern of magnetized regions is recorded by a servo writer during the manufacture of the disk drive 10. The center 50 of track 40 is defined by the circle formed by the set of arcuate segments which comprise the boundaries of the magnetized regions 44, 46 located at the same radial distance from central axis of rotation 18. The patterns of magnetized regions 44, 46 on either side of center 50 of track 40 are recorded by the servo writer such that the magnetized regions 44,46 are circumferentially offset around the circle of track 40.

As the top surface 42 of magnetic disk 14 rotates past servo head 38, when the center of servo head 38 is located over center 50 of track 40, the magnetic flux transitions of the circumferentially offset alternating magnetized regions 44, 46 on either side of the center 50 of track 40, results in a series of pulses generated by servo head 38. This series of pulses can divided into a first series of pulses associated with associated with those magnetized regions 44, 46 circumferentially located around the edge of center 50 of track 40 at a radial distance less than that of center 50 and a second series of pulses associated with those magnetized regions 44, 46 circumferentially located around the edge of center 50 of track 40 at a radial distance greater than that of center 50.

Electronic filtering is performed on the first series and second series of pulses by servo control system 60. Servo control system 60 generates a difference signal from the magnitudes of the filtered versions of the first and second series of pulses. This difference signal, referred to as the position error signal, undergoes analog to digital conversion by servo control system 60. The digitized position error signal undergoes digital signal processing by servo control system 60 to achieve the desired performances characteristics for the control of the servo head 38 and the desired margins of stability for the positioning system. The digital signal processing includes application of the desired control law, notch filtering, and compensation to the digitized position error signal. This digitally processed position error signal then undergoes digital to analog conversion by application of the zero order hold function of this embodiment, contained in servo control system 60. The resulting analog signal, which is the output of servo control system 60, is used to activate rotary actuator motor 24 so that the offset of servo head 38 from center 50 of track 40 is minimized. The operation of the servo control system 60 is discussed in the context of minimizing the offset of the servo head 38 from the center 50 of track 40. One skilled in the art will recognize that the servo control system 60 operates, in a similar manner, to minimize the offset of the servo head 38 from the center of any given track on surface 42 of magnetic disk 14, when the servo control system 60 is controlling the position of the servo head 38 over that track. Although the type of disk drive 10 which incorporates the zero order hold function of this embodiment is a dedicated servo disk drive, one skilled in the art will recognize that the zero order hold function of this embodiment may be incorporated in an embedded servo disk drive to serve the same purpose. In the case of an embedded servo disk drive, the alternating magnetized regions 44, 46 which generate the first and second series of pulses are embedded between the sectors of data on the surface of the magnetic disks 14–17.

Figure 2:
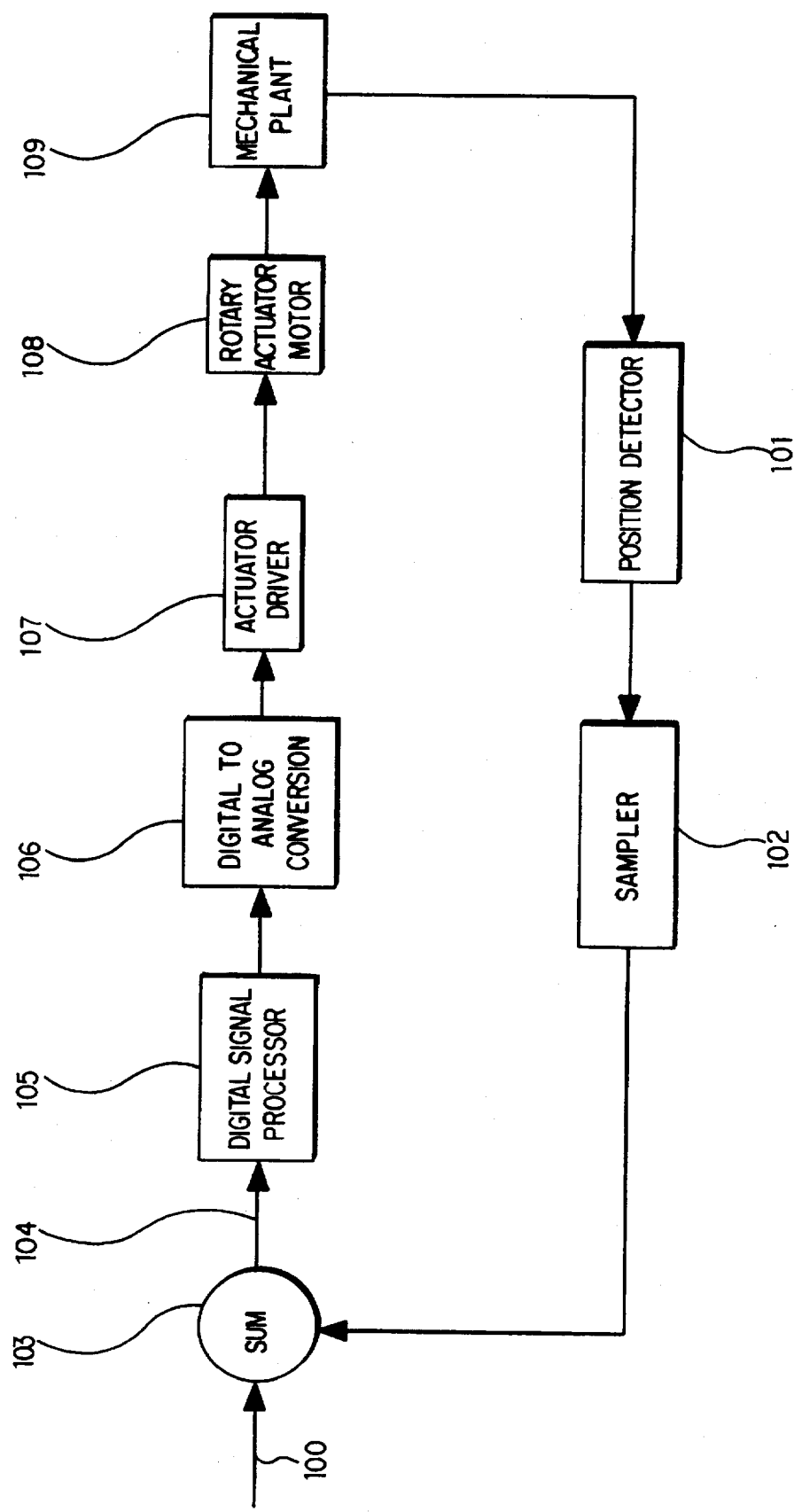
FIG. 2 is a simplified block diagram of digital servo control system and plant for an electro-mechanical positioning system.

Referring particularly to FIG. 2, shown is a simplified block diagram representation of the elements of disk drive 10 as they are relevant to servo control system 60. Position reference signal 100 is a digital representation of a signal which represents the desired position of the servo head 38 relative to center 50 of track 40. Position detector 101 generates a signal responsive to the offset of servo head 38 from the center 50 of track 40 using the first and second series of pulses generated by head 38 moving relative to hard disk surface 42. Sampler 102 performs the conversion of the analog signal output from the position detector 101 into a digital representation. Summation node 103 computes a difference signal 104, known as a position error signal (PES), which is a digital representation of the difference between the position reference signal 100 and the output of the sampler 102. This digital representation of the difference signal 104 undergoes digital signal processing by digital signal processor 105 in which the control law is applied, the system is compensated, and notch filtering is implemented. Digital to analog conversion 106 is performed after the operation of digital signal processor 105. The digital to analog conversion 106 is performed in conjunction with implementing the zero order hold function of this embodiment. The analog output of the digital to analog conversion process is coupled to actuator driver 107. Actuator driver 107 is a power amplifier which supplies the current used to activate rotary actuator motor 108. Mechanical plant 109 is a representation of the mechanical response of the system comprised of the carrier arm 30, suspension arm 34, and the gimble assembly containing the servo head 38.

As is well known in the art of control system design, the actuator driver 107, rotary actuator motor 108, mechanical plant 109, and position detector 101 can each be modeled mathematically and represented as Laplace transform domain transfer functions. Analysis of these elements of the system can be performed in the Laplace transform domain. Additionally, the operation of the sampler 102, the operation performed at the summation node 103, and the operations performed to accomplish the digital signal processing by digital signal processor 105 can be represented in the z-transform domain. Design of these elements of the system can be performed in the z-transform domain.

Figure 3:
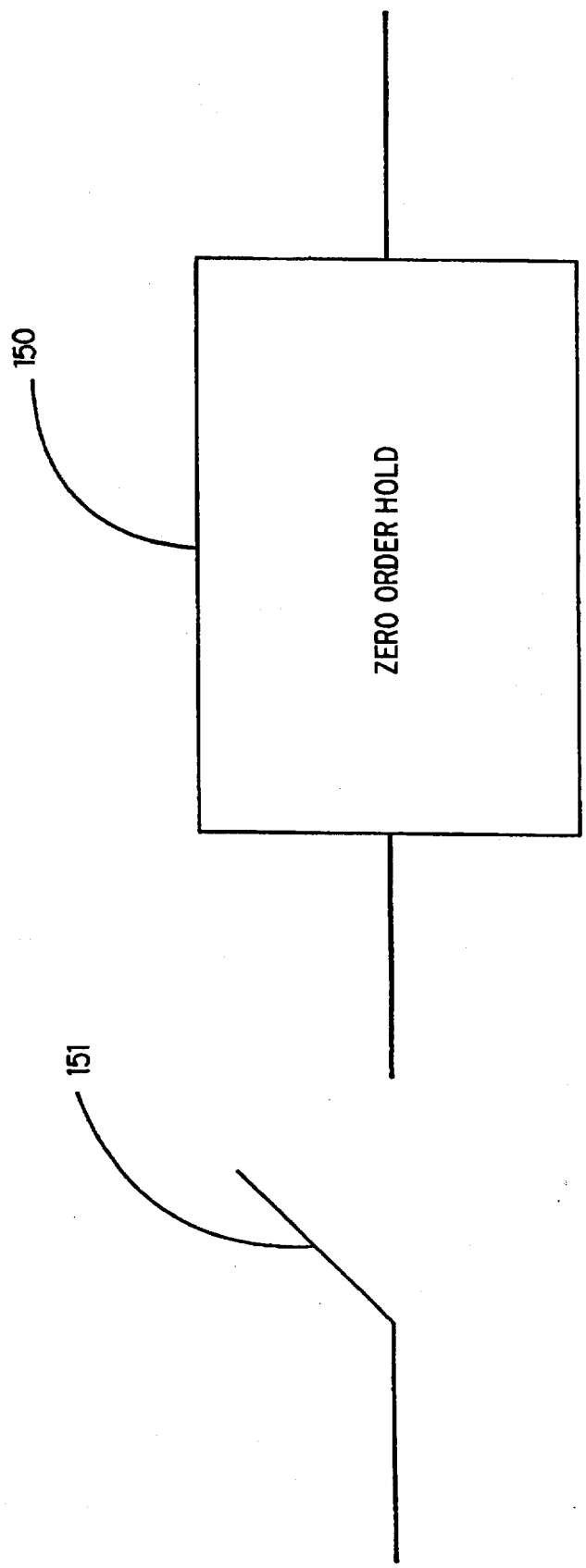
FIG. 3 is a simplified block diagram representation of the digital to analog conversion process employing a zero order hold function.

Digital to analog conversion can be implemented using a conventional zero order hold function. A model of the digital to analog conversion process employing the zero order hold function is shown in FIG. 3. The input to the zero order hold operation 150 can be thought of as a series of weighted impulse samples generated by ideal impulse sampler 151. The zero order hold operation 150 comprises holding the output at a substantially constant value corresponding to the weight of the impulse over the sample interval. A step change in the output of the zero order hold operation 150 occurs upon input of the next weighted impulse sample. By representing the digital input data to the zero order hold function as a train of impulses of varying strength, the zero order hold function can be analyzed in the Laplace transform domain. The Laplace domain transfer function of the conventional zero order hold function, scaled to have unity magnitude at 0 Hz, is given below as:

Equation 1: $ZOH(s)=\{1-e^{(-sT)}\}/(sT)$

Figure 4A:
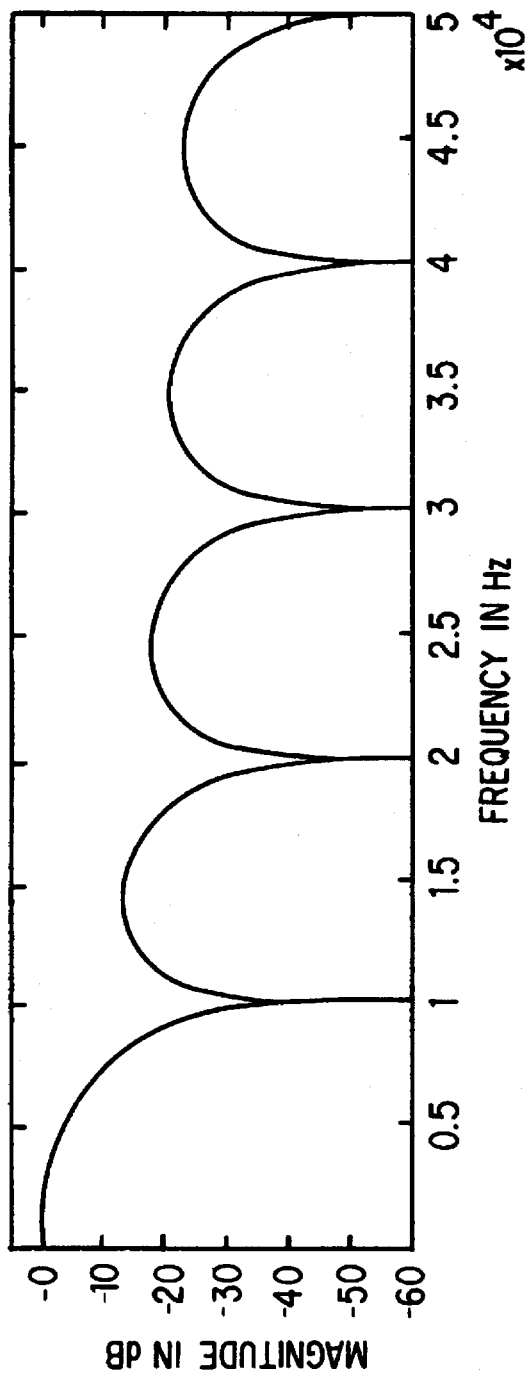
FIG. 4 is a plot of the magnitude and phase response of a conventional zero order hold function as a function of frequency.
Figure 4B:
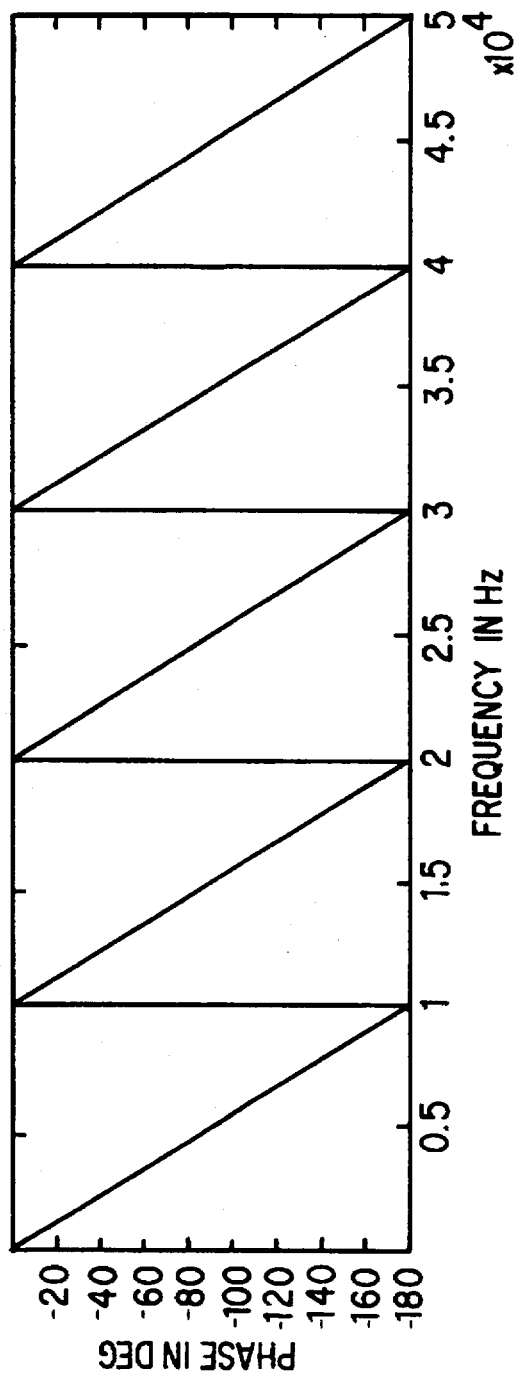

"T" represents the time period between successive impulses applied to the zero order hold function and "s" represents Laplace domain complex frequency. FIG. 4 shows the magnitude and phase response of a typical conventional zero order hold function with respect to the frequency for T=100 μsec. As can be seen from FIG. 4, the magnitude response of the zero order hold function changes from unity to zero as the frequency changes from 0 Hz to the 10000 Hz and the phase shift through the zero order hold function changes from 0 degrees to −180 degrees, linearly, as the frequency changes from 0 Hz to 10000 Hz. Therefore, for a digital control system which has a gain cross over frequency at 1000 Hz, the phase shift contributed by the conventional zero order hold function at the gain cross over frequency will be −18 degrees.

Figure 7:
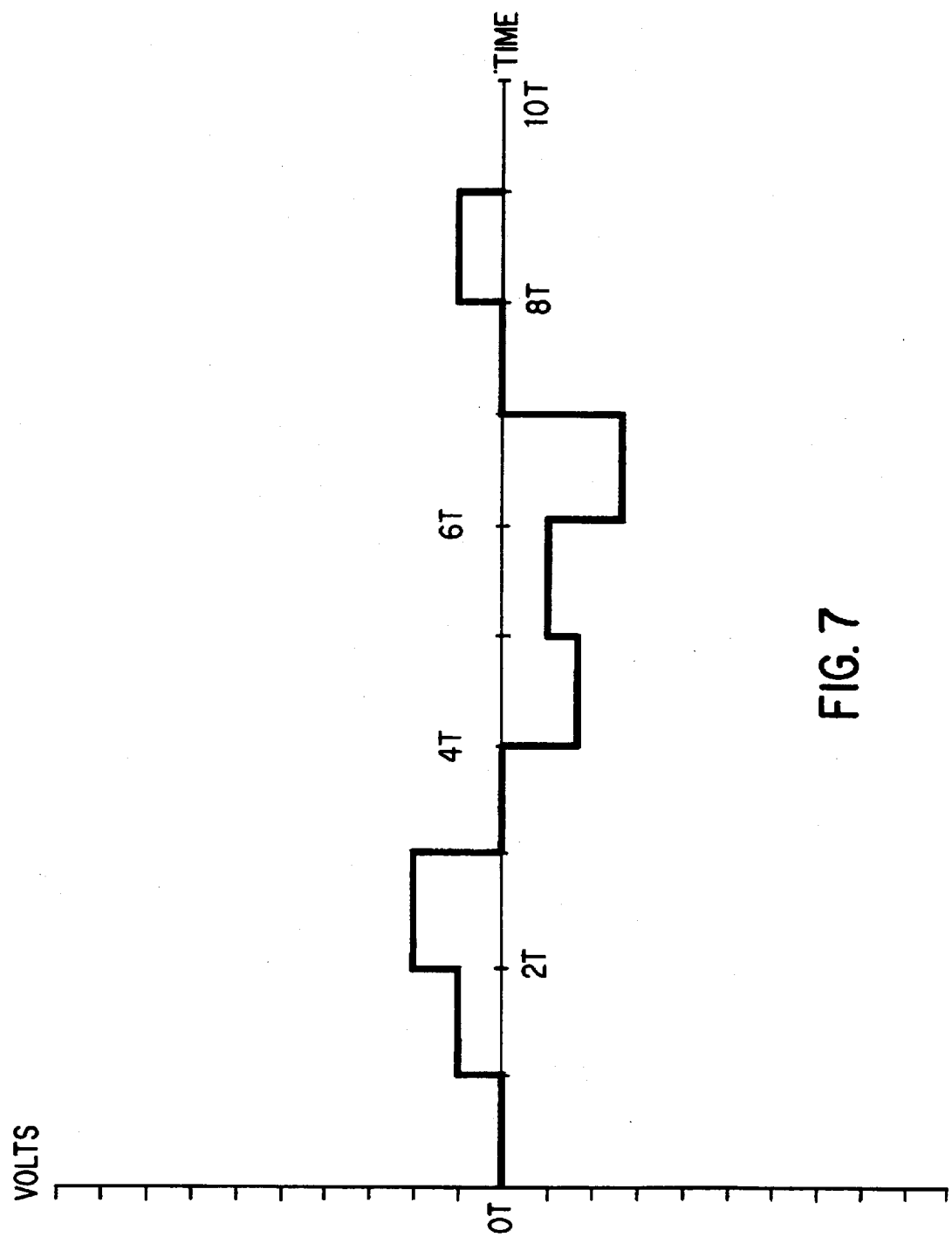
FIG. 7 includes a plot of a typical time domain output of a conventional zero order hold function.

A typical time domain output corresponding to the conventional zero order hold function is shown in FIG. 7. As can be seen from FIG. 7, the output of the conventional zero order hold function is held over the entire time of the sample interval, T, at the same value. The output waveform of the conventional zero order hold function is comprised of a succession these substantially constant amplitude outputs of T seconds in length, as exemplified in FIG. 7.

Figure 8:
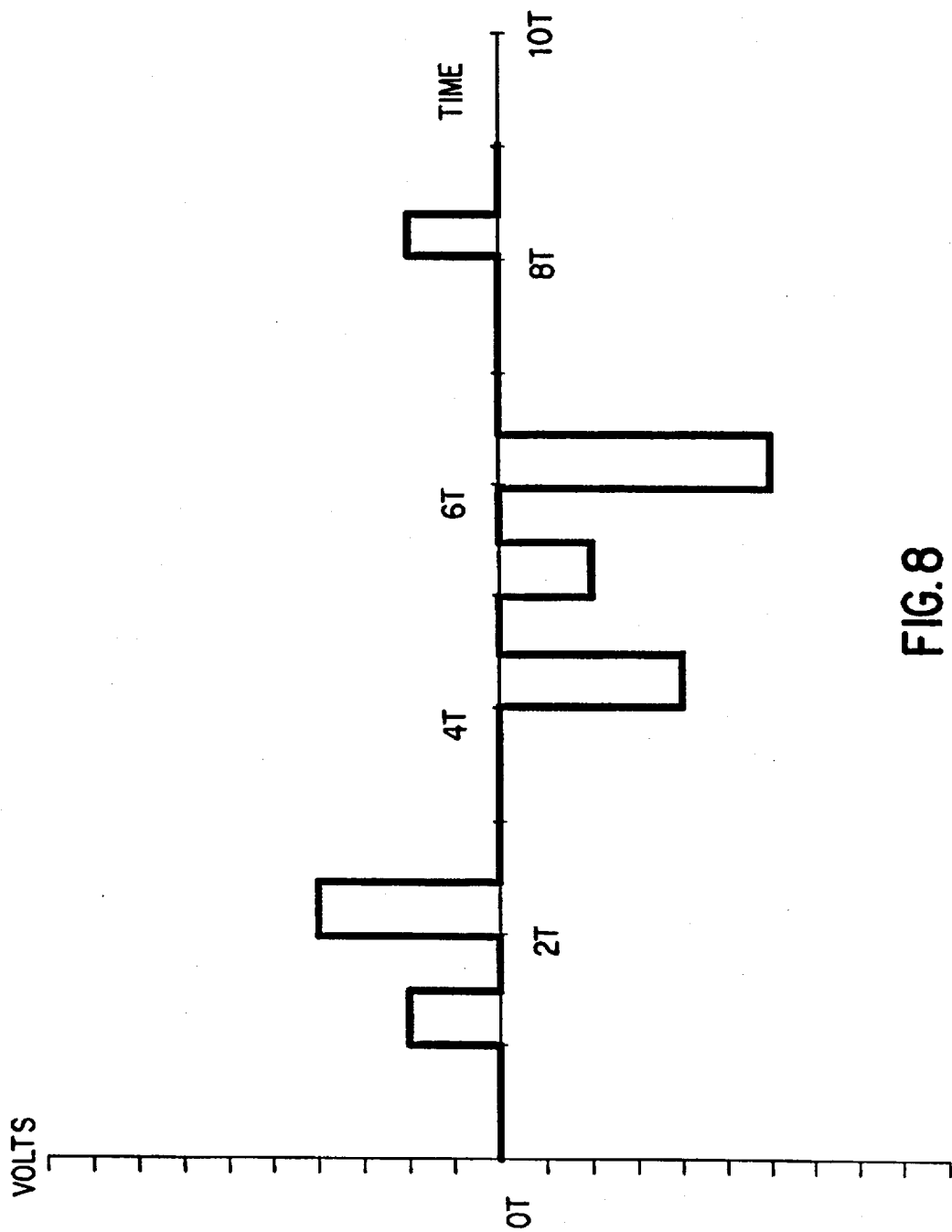
FIG. 8 includes a plot of a typical time domain output of the zero order hold function of this embodiment.

The zero order hold function of this embodiment is implemented by modifying the analog signal output of the conventional zero order hold function. This modification comprises increasing the output amplitude, relative to that of a conventional zero order hold function during a sample interval, by a predetermined factor designated as "of" ($\alpha>1$) and applying this increased amplitude for only a fraction of the sample interval, T, corresponding to a time of T/α seconds. For the remainder of the sample interval T, a time of T(α-1)/α seconds, the analog output is at a substantially constant value for each sample interval. A typical time domain output corresponding to the zero order hold function of this embodiment is shown in FIG. 8. As can be seen from FIG. 8, for which α=2, the zero order hold function of this embodiment has increased amplitude by a factor of α (relative to the output of FIG. 7) and has a reduced period of time, by a factor of 1/α, during the sample period T (relative to the output of FIG. 7) for which the output can be a value other than the substantially constant value (in the time domain output shown in FIG. 8 this substantially constant value is zero). Therefore, the scale factor α also has the effect of determining a duty cycle for the output of zero order hold function of this embodiment.

The Laplace domain transfer function of the zero order hold function of this embodiment, scaled to have unity magnitude at 0 Hz, is given below as:

Equation 2: $ZOH^*(s)=\{1-e^{-[T(s/\alpha)]}\}/\{T(s/\alpha)\}$

"T" represents the time period between successive impulses applied to the zero order hold function, "s" represents Laplace domain complex frequency, and "α" ($\alpha>1$) represents the scaling factor. The effect on the magnitude and phase response of the zero order hold function for α=4 and T=100 μsec can be seen in FIG. 5. For a digital control system which has a gain cross over frequency of 1000 Hz, the phase shift at the gain cross over frequency is −4.5 degrees, a reduction in the contribution of phase lag by 13.5 degrees compared to the conventional zero order hold function. The zero order hold function of this embodiment has the effect of reducing the magnitude of the slope of the phase vs frequency response curve, as compared to a conventional zero order hold function, while avoiding attenuation of the system gain at low frequency, thereby improving the system phase margin at the gain cross over frequency. In contrast, a lead network, used to add phase lead to offset the phase lag contributed by other elements of the system, results in substantial low frequency attenuation of the system gain at low frequency. In addition, the zero order hold function of this embodiment provides an improvement in the gain margin of the system by increasing the phase cross over frequency so that the attenuation of the system gain below unity has been increased, relative to that of the system employing a conventional zero order hold function at its phase cross over frequency. Because of the necessity to tightly control the phase margin budget in the design of the digital servo control system in a disk drive, the zero order hold function of this embodiment is particularly well suited for application in a disk drive digital servo control system.

Figure 6:
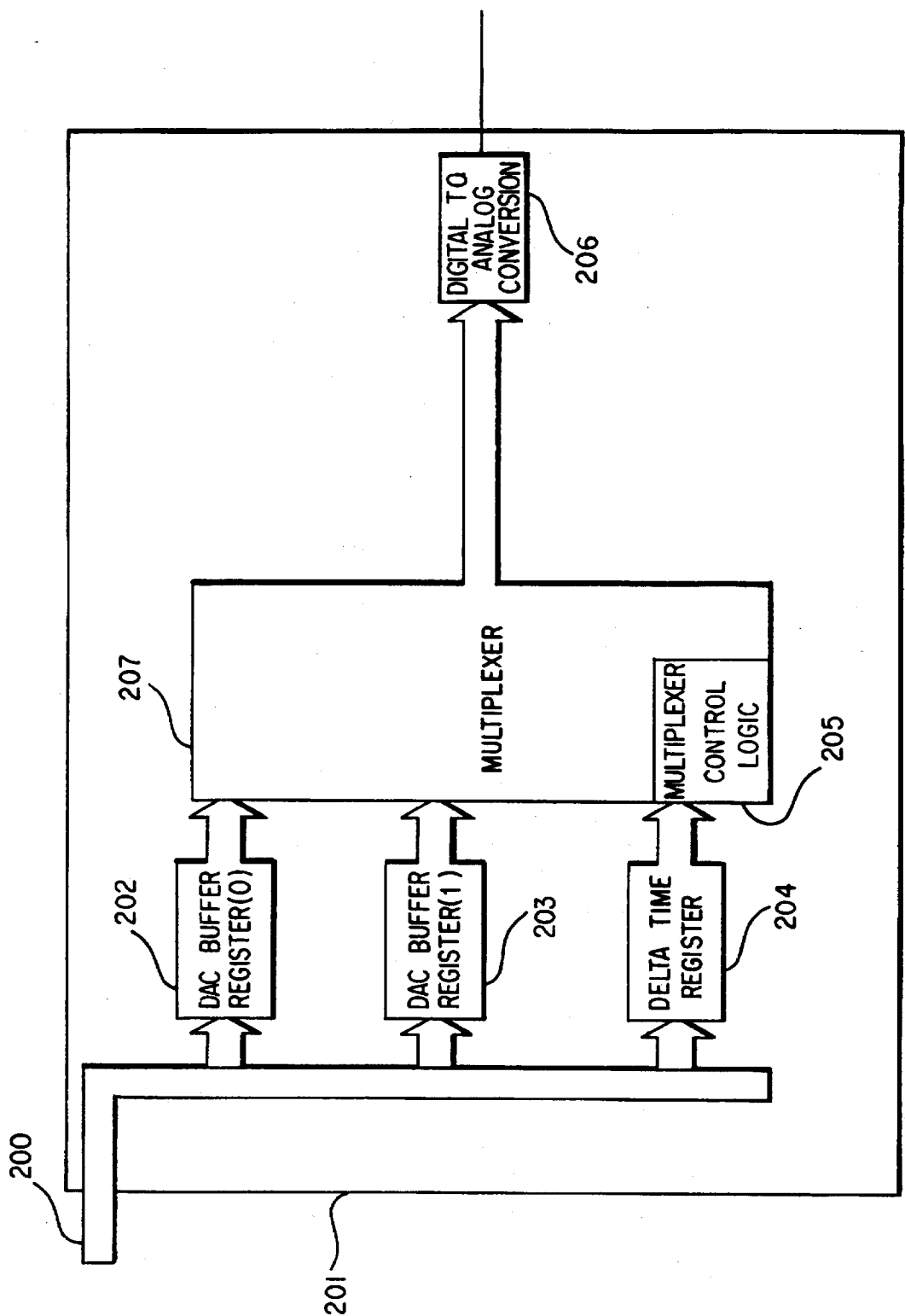
FIG. 6 is a block diagram of a hardware implementation of the zero order hold function of this embodiment.

FIG. 6 contains a block diagram of the preferred hardware implementation of the zero order hold function of this embodiment. The output from the operation of digital signal processor 105 is sent over digital bus 200 to the apparatus for implementing the zero order hold function of this embodiment 201. Digital bus 200 is connected to storage elements, such as registers or latches, to which digital data resulting from the operation of digital signal processor 105 is sent. In the hardware implementation of this embodiment, digital bus 200 is connected to DAC buffer register(0) 202, DAC buffer register(1) 203, and delta time register 204. The analog output from the digital to analog converter 206 is coupled to actuator driver 107.

The result of the operation of digital signal processor 105 is a digital value sent over digital bus 200 to DAC buffer register(0) 202. This digital value corresponds to the desired value of the analog output from digital to analog converter 206 to input to actuator driver 107 for activation of rotary actuator motor 108 in a conventional zero order hold function scaled by a factor of α. This scaling is performed by digital signal processor 105. The value of scale factor α could be stored in firmware which controls digital signal processor 105 or hard coded into a multiplier which may be present in digital signal processor 105. DAC buffer register (0) 202 is updated, once during each sample interval, as digital signal processor 105 operates upon PES 104 when servo head 38 is controlled by servo control system 60.

As part of an initialization process, DAC buffer register(1) 203 and delta time register 204 are loaded with the appropriate digital values by digital signal processor 105. Digital signal processor 105 operation loads an offset digital value into DAC buffer register(1) 203 over digital bus 200. This offset digital value corresponds to the offset in the output from digital to analog convertor 206 to actuator driver 107 necessary to overcome any bias forces exerted on rotary actuator motor 24. Digital signal processor 105 loads delta time register 204 with a digital value of T/α, the portion of time during the sample period T for which the output of digital to analog converter 206 is determined by the contents of DAC buffer register(0) 202.

Multiplexer 207 controls the input to digital to analog converter 206 responsive to the value in delta time register 204 using multiplexer control logic 205. The multiplexer control logic 205 uses the value in delta time register 204 to control the timing of the switching of the multiplexer output between the contents of DAC buffer register(0) 202 and DAC buffer register(1) 203. Multiplexer 207 loads the digital value in delta time register 204, corresponding to the time period of length T/α, into the multiplexer control logic. Digital to analog converter 206 typically requires several microseconds to perform a conversion. Because of this conversion time, the digital to analog converter would optimally receive a digital input slightly in advance, by an amount equal to the digital to analog conversion time, of the time at which the output is required. However, it will be recognized that in this application a range of times around this optimal time are acceptable. Just prior to the start of a given sample period of total length of T seconds, multiplexer 207 sends the contents of DAC buffer register(0) 202 to the input of digital/analog converter 206. For a time of T/α seconds after the start of the sample period, digital to analog converter 206 produces a substantially constant analog output corresponding to the digital value in DAC buffer register (0) 202. Just prior to T/α seconds into the sample period, multiplexer 207 sends the contents of DAC buffer register(1) 203 to the input of digital to analog converter 206. For the remainder of the sample period after T/α seconds, a time of T(α-1)/α seconds, digital to analog converter 206 produces a substantially constant analog output corresponding to the digital value in DAC buffer register(1) 203. During successive sample periods the input to digital to analog converter 206 is generated in a like manner.

In a first alternative of the preferred hardware implementation of the zero order hold function of this embodiment, multiplication of the digital value in DAC buffer register(0) 202 by scale factor α could be accomplished in hardware instead of in digital signal processor 105. This hardware multiplier could be located between digital signal processor 105 and DAC buffer register(0) 202, between DAC buffer register(0) 202 and multiplexer 207, in the data path followed by the contents of DAC buffer register(0) 202 internal to multiplexer 207, or between the output of multiplexer 207 and digital to analog converter 206, if provision is made to send the contents of DAC buffer register(1) 203 to digital to analog converter 206 from the output of multiplexer 207 without multiplication by scale factor α. Multiplication of the values in DAC buffer register(0) 202 by typical values of α, such as 2 or 4, may be accomplished by shifting the digital values in DAC buffer register(0) 202 by one or two places to the left in multiplexer 207. A bit shift of one place to the left would correspond to multiplication by 2 and a bit shift of two places to the left would correspond to multiplication by 4. This method of multiplication would eliminate the need for a separate hardware multiplier while limiting the number of different values for scale factor α which could be used.

As can be seen from the various implementations of the zero order hold function of this embodiment, the operations of multiplication by scale factor α and the multiplexing of the value in DAC buffer register(0) 202 may done without regard to the order of the operations. That is, digital signal processor 105 may perform the multiplication operation, place the result in the buffer registers, whereupon multiplexer 207 sends it to digital to analog converter 206 at the appropriate time, or digital signal processor may place the unscaled digital value into DAC buffer register(0) 202, whereupon multiplexer 207 sends it to a hardware multiplier for multiplication by a and delivery to digital to analog converter 206. With either order of the operations, the resulting output of digital to analog converter 206 is the same.

A multiplier may be implemented using a microprocessor, a conventional hardware multiplier, or a hardware multiplier which accomplishes multiplication through bit shifting of a digital value in a register. Multiplexer 207 may be implemented in hardware through the use of a microprocessor or through the design of a state machine dedicated to accomplishing only the multiplexing tasks described above. It will be recognized that DAC buffer register(0) 202, DAC buffer register(1) 203, and delta time register 204 can be incorporated in multiplexer 207. Methods of hardware implementation of a multiplier and multiplexer 207 are well known by one skilled in the art of digital design.

In a second alternative of the preferred hardware implementation of the zero order hold function of this embodiment, the timing value, corresponding to T/α seconds, and the offset digital value may be "hard coded" into multiplexer 207, thereby eliminating the need for DAC buffer register(1) 203 and delta time register 204. Additionally, the scale factor α could be hard coded into the multiplier, eliminating the need for a register to receive and store the scale factor from digital signal processor 105. This second alternative of the preferred hardware implementation allows for a reduction in the hardware complexity at the expense of the flexibility in the configuration of the zero order hold function of this embodiment.

Figure 5A:
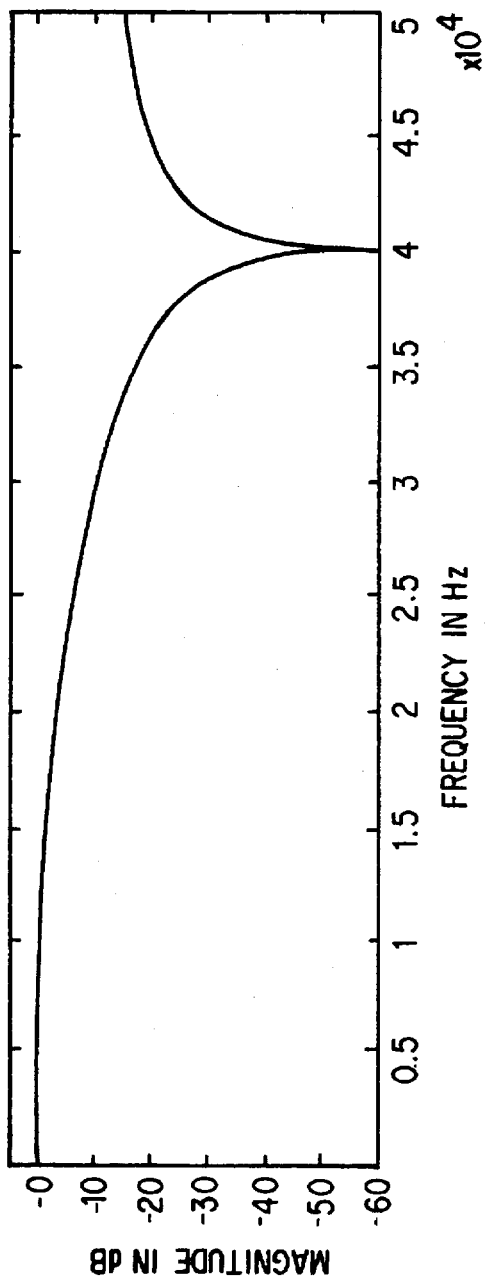
FIG. 5 is a plot of the magnitude and phase response of the zero order hold function of this embodiment as a function of frequency.
Figure 5B:
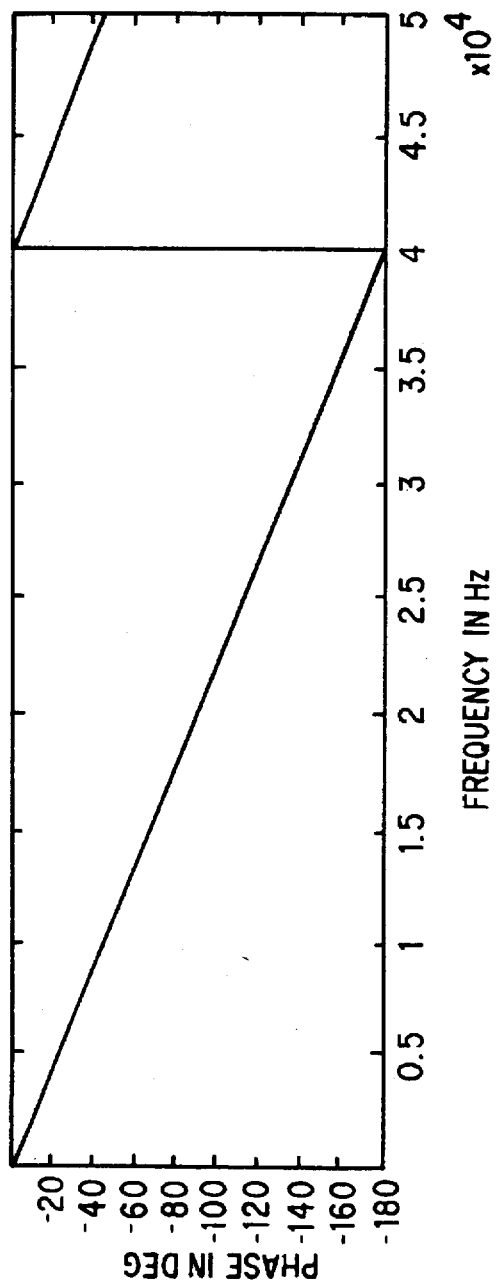

The preferred hardware implementation and the first, the second, and the third alternative hardware implementations of the zero order hold function of this embodiment, for α=4 and T=100 μsec, each generate the magnitude and phase response shown in FIG. 5.

Figure 9:
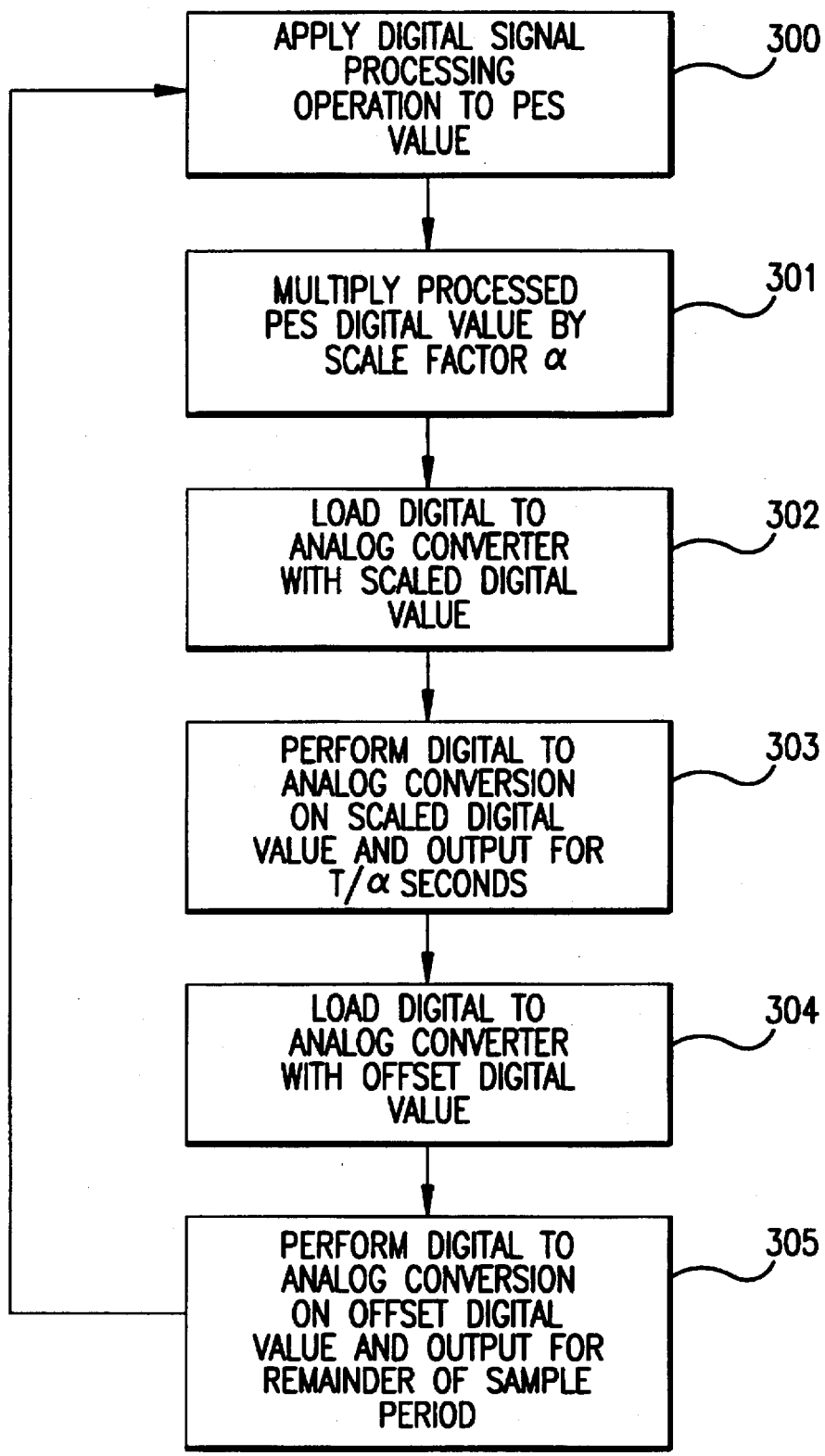
FIG. 9 is a process flow diagram of the preferred method for implementing the zero order hold function of this embodiment.

The preferred method of implementing the zero order hold function of this embodiment employs digital signal processor 105 to control the output of a conventional digital to analog converter directly. FIG. 9 contains a process flow diagram for the implementation of the zero order hold function of this embodiment in the digital signal processor 105. The control law, compensation and notch filtering are applied 300 to the digital value of PES 104. Next, the resulting digital value is multiplied by the scale factor α 301 by digital signal processor 105. Just prior to the beginning of the sample period the digital to analog converter is loaded 302 with the scaled digital value. Digital to analog conversion is performed 303 upon the scaled digital value to generate a substantially constant analog voltage output to actuator driver 107 for T/α seconds, beginning at the start of the sample period. Just prior to T/α seconds into the sample period, the digital to analog converter is loaded 304 with an offset digital value by digital signal processor 105. Digital to analog conversion is performed 305 on the offset digital value. The digital to analog converter generates a substantially constant analog voltage which is output to actuator driver for the remainder of the sample period, a time of {T(α-1)/α} seconds, beginning at T/α seconds. Control is then transferred back to the beginning step of the method, as shown in FIG. 9, for processing of the next PES 104 value.

An alternative to the preferred method of implementing the zero order hold function of this embodiment employs interrupts to control the timing of digital signal processor in sending digital values to the digital to analog converter. In this alternative of the preferred method, an interrupt counter generates an interrupt prior to T/α seconds to trigger digital signal processor 105 to send the offset digital value to the digital to analog converter. The interrupt counter then generates another interrupt prior to the end of the sample period, to trigger digital signal processor 105 to send the processed PES 104 value for the next sample period to the digital to analog converter.

Figure 10:
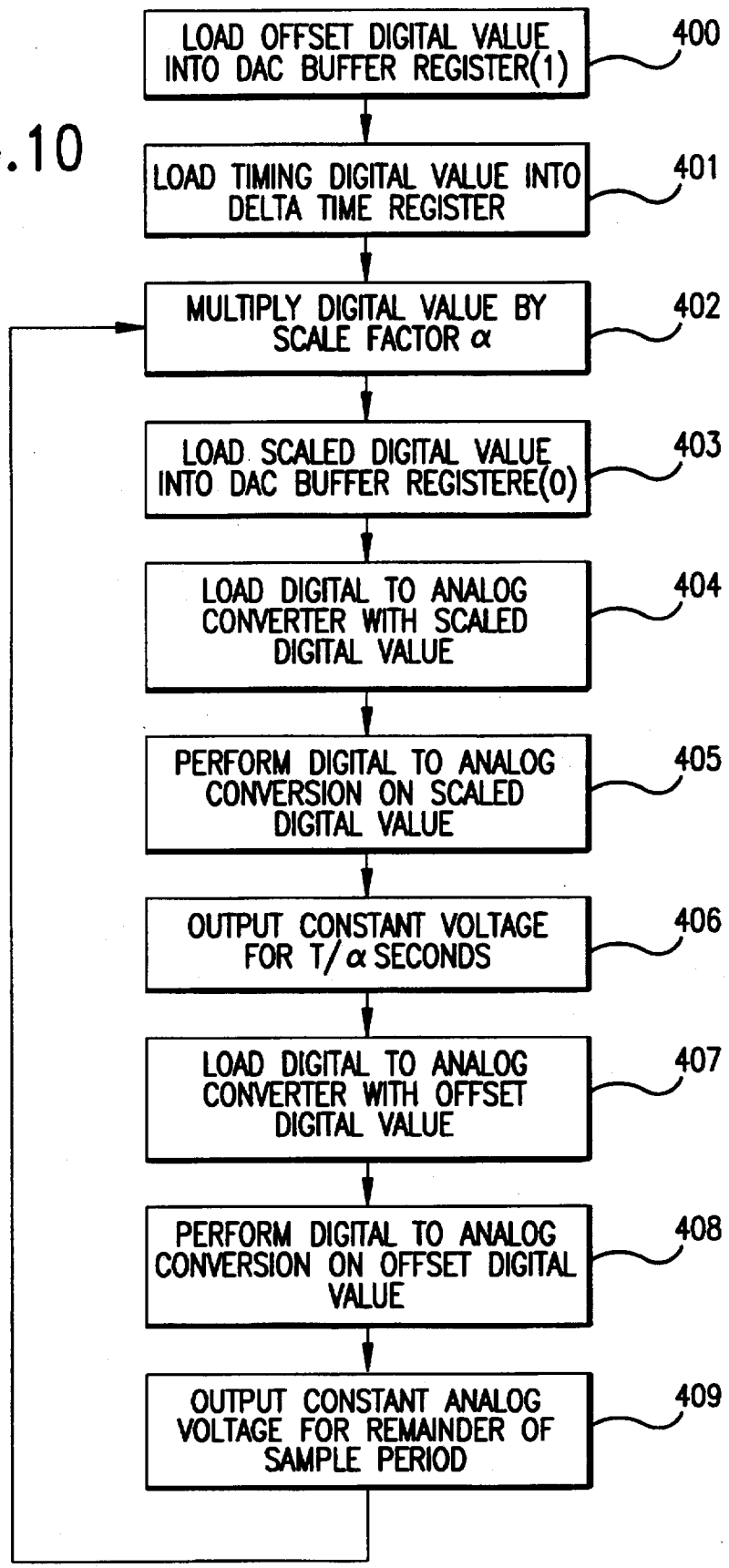
FIG. 10 is a process flow diagram for using the preferred hardware implementation of the zero order hold function of this embodiment.

FIG. 10 contains a flow diagram of a method for implementing the zero order hold function of this embodiment employing the preferred hardware implementation of FIG. 6. Several register initialization steps are necessary. The digital signal processor 105 loads 400 an offset digital value into DAC buffer register(1) 203. Then, digital signal processor operation 105 loads 401 a timing digital value into delta time register 204. The digital value loaded into delta time register 204 corresponds to the period of time T/α seconds. One skilled in the art will recognize that these registers may be initialized in any order without affecting the performance of the zero order hold function of this embodiment.

After these register initialization steps, the portion of the flow diagram corresponding to the operation of the digital control system in controlling the mechanical plant is entered. A digital value, which is the result of the operation of the digital signal processor 105 upon PES 104 is multiplied 402 by scale factor α and loaded 403 into DAC buffer register(0) 202. This digital value corresponds to the desired analog output of digital to analog converter 206 for input into actuator driver 107 to activate rotary actuator motor 108. Next, multiplexer 207 loads 404 digital to analog converter 206 with the scaled digital value from DAC buffer register(0) 202 just prior to the beginning of the sample period. Digital to analog conversion is performed 405 upon the scaled digital value from DAC buffer register(0) 202 by digital to analog converter 206 and a substantially constant analog signal is output 406 to actuator driver 107 for T/α seconds beginning at the start of the sample period.

Just prior to T/α seconds into the sample period, multiplexer 207 loads 407 digital to analog converter 206 with the offset digital value in DAC buffer register(1) 203. Digital to analog conversion is performed 408 by digital to analog converter 206 and a substantially constant analog signal is output 409 to actuator driver 107 for the remainder of the sample period, T(α-1)/α seconds, beginning at T/α into the sample period. These steps, beginning with the multiplication 402 of the value to be loaded into DAC buffer register (0) by scale factor α using digital signal processor 105, are repeated successively every sample period to generate an analog waveform having the characteristics of the waveform shown in FIG. 8.

The term "substantially constant", as it has been used herein to describe the analog output of a digital to analog converter used in implementing the zero order hold function of this embodiment, refers to the analog output of the digital to analog converter having an output voltage within the offset tolerances of the digital to analog converter of the target voltage and having typical levels of electrical noise superimposed upon the output voltage.

Although an embodiment of the invention has been illustrated, and that form described, it is readily apparent to those skilled in the art that various modifications may be made therein without departing from the spirit of the invention or from the scope of the appended claims.

What is claimed is:

1. In a sampled data system having a digital to analog conversion element, said sampled data system for generating, in succession, a plurality of digital values at a predetermined rate corresponding to a predetermined time interval, a method for reducing the phase lag generated by said digital to analog conversion element, comprising the steps of:

generating a first substantially constant analog voltage, determined by the product of one of said plurality of digital values and a scale factor, for a first time interval determined by a ratio of said predetermined time interval and said scale factor, using said digital to analog conversion element; and generating a second substantially constant analog voltage, determined by an offset digital value, for a second time interval equal to the difference between said predetermined time interval and said first time interval, using said digital to analog conversion element.

2. The method as recited in claim 1, further comprising:

multiplying one of said plurality of digital values by said scale factor yielding a scaled digital value, said step of multiplying one of said plurality of digital values occurring prior to said step of generating a first substantially constant analog voltage.

3. The method as recited in claim 2, wherein:

said step of generating a first substantially constant analog voltage includes the step of loading said scaled digital value into said digital to analog conversion element.

4. The method as recited in claim 3, wherein:

said step of generating a second substantially constant analog voltage includes the step of loading said offset digital value into said digital to analog conversion element.

5. The method as recited in claim 4, wherein:

said sampled data system includes a digital control system in a hard disk drive.

6. In a sampled data system having a digital to analog conversion element, said sampled data system for generating digital data at a predetermined rate corresponding to a predetermined time interval, an apparatus for reducing phase lag generated by said digital to analog conversion element, comprising:

a means for multiplying said digital data by a scale factor for generating scaled digital data; and a means for multiplexing having a multiplexed output, said means for multiplexing arranged to receive said scaled digital data from said means for multiplying, said means for multiplexing for selectively outputting said scaled digital data and an offset digital value from said multiplexed output at times determined by said scale factor and said predetermined time interval, said multiplexed output coupled to said digital to analog conversion element.

7. The apparatus as recited in claim 6, wherein:

said means for multiplexing includes multiplexing control logic for controlling the selective outputting of said scaled digital value and said offset digital value from said multiplexed output.

8. The apparatus as recited in claim 7, wherein:

said means for multiplying includes a digital signal processing element.

9. The apparatus as recited in claim 8, wherein:

said means for multiplexing includes a first storage element arranged to receive said scaled digital data from said digital signal processing element.

10. The apparatus as recited in claim 9, wherein:

said means for multiplexing includes a second storage element arranged to receive said offset digital value from said digital signal processing element.

11. The apparatus as recited in claim 10, wherein:

a ratio of said predetermined time interval and said scale factor forms a timing digital value, said means for multiplexing includes a third storage element arranged to receive said timing digital value from said digital signal processing element.

12. The apparatus as recited in claim 11, wherein:

said sampled data system includes a digital control system in a hard disk drive.

13. In a sampled data system having a digital to analog conversion element, said sampled data system for generating digital data at a predetermined rate corresponding to a predetermined time interval, an apparatus for reducing phase lag generated by said digital to analog conversion element, comprising:

a means for multiplexing arranged to receive said digital data and having a multiplexed output coupled to said digital to analog conversion element; and a means for multiplying said digital data by a scale factor to generate scaled digital data, said means for multiplying included in said means for multiplexing, said means for multiplexing for selectively outputting said scaled digital data and an offset digital value from said multiplexed output at times determined by said scale factor and said predetermined time interval.

14. The apparatus as recited in claim 13, wherein:

said multiplexer includes multiplexing control logic for controlling the selective outputting of said scaled digital value and said offset digital value from said multiplexed output.

15. The apparatus as recited in claim 14, wherein:

said means for multiplexing includes a first storage element arranged to receive said digital data.

16. The apparatus as recited in claim 15, wherein:

said means for multiplexing includes a second storage element arranged to receive said offset digital value.

17. The apparatus as recited in claim 16, wherein:

a ratio of said predetermined time interval and said scale factor forms a timing digital value, said means for multiplexing includes a third storage element arranged to receive said timing digital value.

18. The apparatus as recited in claim 17, wherein:

said scale factor includes a scaling digital value, said means for multiplying includes a fourth storage element arranged to receive said scaling digital value.

19. The apparatus as recited in claim 18, wherein said means for multiplying includes a hardware multiplier.

20. The apparatus as recited in claim 19, wherein:

said sampled data system includes a digital control system in a hard disk drive.

* * * * *